United States Patent [19]
Niemann et al.

[11] Patent Number: 5,856,231
[45] Date of Patent: Jan. 5, 1999

[54] PROCESS FOR PRODUCING HIGH-RESISTANCE SILICON CARBIDE

[75] Inventors: Ekkehard Niemann, Maintal; Juergen Schneider, Kirchzarten; Harald Mueller, Hinterzarten; Karin Maier, deceased, late of Freiburg; Hildegard Inge Maier, heiress, Tübingen-Derendingen; Elke Maier, heiress, Ulm-Lehr, all of Germany

[73] Assignee: Daimler-Benz Aktiengesellschaft, Munich, Germany

[21] Appl. No.: 596,119

[22] PCT Filed: Jul. 21, 1994

[86] PCT No.: PCT/EP94/02400

§ 371 Date: Apr. 12, 1996

§ 102(e) Date: Apr. 12, 1996

[87] PCT Pub. No.: WO95/04171

PCT Pub. Date: Feb. 9, 1995

[30]     Foreign Application Priority Data

Jul. 31, 1993 [DE] Germany .......................... 43 25 804.2

[51] Int. Cl.$^6$ .................................................. H01L 21/265
[52] U.S. Cl. ......................... 438/519; 438/543; 438/931; 438/403
[58] Field of Search ................................ 437/100, 20, 22; 148/DIG. 148; 257/77; 438/519, 521, 546, 547, 403, 931

[56]     References Cited

U.S. PATENT DOCUMENTS

| 3,344,071 | 9/1967 | Cronin . |
| 4,853,077 | 8/1989 | Lambert et al. . |
| 5,030,580 | 7/1991 | Furukawa et al. ......................... 437/22 |
| 5,087,576 | 2/1992 | Edmond et al. ........................... 437/22 |
| 5,384,270 | 1/1995 | Ueno ....................................... 437/100 |

FOREIGN PATENT DOCUMENTS

| 1956011 | 4/1971 | Germany . |
| 4009837 | 10/1990 | Germany . |
| 58-191419 | 8/1983 | Japan . |
| WO89/06438 | 7/1989 | WIPO . |

OTHER PUBLICATIONS

7th Trieste Semiconductor Symposium on Wide–Band–Gap Semiconductors, Trieste, Italy, 8–12 Jun. 1992, ISSN 0921–4526, Physica B, Apr. 1993, Netherlands, pp. 199–206, Schneider, J. et al "Point defects in silicon carbide".

Journal of Applied Physics, Oct. 1976, USA, vol. 47, Nr. 10, pp. 4546–4550, ISSN 0021–8979, Suzuki A et al, "Liquid-–phase epitaxial growth of 6H–SiC by the dipping technique for preparation of blue–light–emitting diodes".

Applied Physics Letters, Mar. 19, 1990, USA, vol. 56, Nr. 12, pp. 1184–1186, ISSN 0003–6951, Schneider J. et al "Magnetic circular dichroism and optically detected EPR of a vanadium impurity in 6H–silicon carbide".

17th International Conference on Defects in Semconductors, Gmunden, Austria, Jul. 18–23, 1993, ISSN 0255–5476 Material Science Forum, 1994, Switzerland, pp. 75–79 Reinke J. et al, "Magnetic circular dichroism and optically detected EPR of a vanadium . . . carbide".

Proceedings of the IEEE, May 1991, USA, vol. 79, Nr. 5, pp. 677–701, ISSN 0018–9219, Davis R.F. et al, "Thin film deposition and microelectronic and optoelectronic device fabrication . . . silicon carbide".

Soviet Physics Semiconductors, vol. 21, No. 9, Sep. 1987, New York, USA, pp. 1017–1020, Yu. A. Vodakov et al, "Electrical properties of a p–n–n+ structure formed in silicon carbide by implantation of aluminum ions".

Materials Science and Engineering B11, 1992, pp. 27–30, K. Maier et al, "Electron spin ressonance studies of Transition metal deep level impurities in SiC".

Applied Physics Letters, vol. 48, No. 17, 28 Apr. 1986, Seiten 1162–1164.

"Physical Review B", vol. 26, No. 4, Aug. 15, 1982, Seiten 2250–2252.

Buch "Semiconductors and Semimetals", vol. 19, Academic Press, 1983, New York u.a., Eds.: R.K. Willardson u.a., Seiten 1–5.

"Physica B", vol. 185, Nos. 1–4, Apr. 1993, Seiten 199–206.

*Primary Examiner*—Jey Tsai
*Assistant Examiner*—S. Mulpuri
*Attorney, Agent, or Firm*—Venable; George H. Spencer; Norman N. Kunitz

[57]      ABSTRACT

A process for producing high-resistance SiC from low-resistance SiC starting material. The flat (shallow) donor levels of a prevailing nitrogen impurity are overcompensated by admixture of a trivalent doping element with the concentration of the doping element in the SiC being such that it changes the conductivity type from a n-conductivity to a p-conductivity. In addition, a transition element is added having donor levels approximately in the middle of the SiC energy gap, so that the excess acceptor levels are in turn compensated and a high specific resistance is achieved.

15 Claims, No Drawings

PROCESS FOR PRODUCING HIGH-RESISTANCE SILICON CARBIDE

CROSS REFERENCE TO RELATED APPLICATION

This application is a National Stage Application under Section 371 of PCT/EP94/02400, filed Jul. 21, 1994.

BACKGROUND OF THE INVENTION

The invention relates to a process for producing high-resistance silicon carbide (SiC) from a low-resistance silicon carbide starting material.

SiC in crystalline form has properties of a semiconducting material and is increasingly employed in various semiconductor structural elements. For many applications it is desirable that the substrate, i.e., the starting crystal, be a disk of a high-resistance material. This monocrystal then can serve as the: common substrate for a plurality of individual structural elements which are electrically insulated. Many processes which are performed with pure Si, for example, can be transferred to SiC, i.e., in detail, masking technique with a thermal oxide, ion implantation, dry etching of structures, epitaxia growth and contacting.

The understanding of defects with low levels in the energy gap of SiC is still very incomplete. For example, little is known about transition elements in SiC, either regarding their defect structure (substitutionally or interstitially) or their suspected electrical activity as interference locations with states energetically located far below the conductivity band. An important characteristic of SiC is its polytypicism, i.e., its occurrence in several modifications. Hexagonal 4H- and 6H-SiC with an energy gap of 3.0 eV, and cubic 3D-SiC with an energy gap of 2.4 eV are of interest in connection with electronic applications. Very little is known in particular about the level position of titanium impurities, which are practically unavoidable with deep-drawn SiC. The knowledge and control of impurities with low energy levels, however, is absolutely required in order to assure the quality of opto-electronic and electronic structural elements on the basis of SiC.

It is known from the publication by J. Schneider. H. D. Müller, K. Maier, W. Wilkening, F. Fuchs, A. Dörnen, S. Leibenzeder and R. Stein, Appl. Phys. Lett., 56 (1990) p. 1184, that vanadium impurities can occur in SiC crystals in the form of amphoteric impurities with low energy levels. This means that at least three different charge states of vanadium occur in SiC. Two new levels are created in the energy gap by means of vanadium. Based on this it was suspected that vanadium can reduce the life of minority carriers in SiC. In a later publication by K. Maier, J. Schneider, K. Wilkening, S. Leibenzeder and R. Stein "Electron Spin Resonance Studies of Transition Metal Deep Level Impurities in SiC", Materials Science and Engineering B11 (1992), pp. 27 to 30, these levels are also researched. This also does not contain any suggestions for purposefully inserting impurities in p-doped 4H- and 6H-SiC in order to compensate them electrically and to produce high-resistance SiC.

From U.S. Pat. No. 3,344,071 it is known how it is possible to produce high-resistance material from GaAs crystals drawn from the melt by purposeful doping with chromium. In connection with the n-type GaAs it is necessary to additionally admix a substance acting as an acceptor.

It is unknown so far how, in the case of SiC, the effects of flat (shallow) interference locations can be canceled and high-resistance material generated.

SUMMARY OF THE INVENTION

It is the object of the invention to produce SiC with high resistance, wherein the effect of impurities is to be compensated.

This object is attained by a process for producing high-resistance silicon carbide from a low-resistance silicon carbide starting material, wherein the shallow donor levels of the prevailing nitrogen impurities in the starting material are overcompensated by the addition of a trivalent element with shallow acceptor levels introduced by doping in the SiC starting material in a concentration which changes the conductivity type from n- to p- conductivity, and a transition element which, in SiC, has donor levels approximately in the center of its energy gap is added, by doping to, in turn, compensate the excess acceptor levels, so that a high specific resistance is achieved.

The above described process according to the invention has the advantages of making it possible to produce a material such as SiC, which can be employed for high temperatures, with sufficient high resistance. By means of this it is then possible to produce lateral structural elements of SiC on an insulated SiC substrate. These structural elements can then also be employed at higher ambient temperatures.

DETAILED DESCRIPTION OF THE PREFERRED EMBODIMENTS

The difficulty in creating a high-resistant material from SiC lies in that with the conventional sublimation process in accordance with Lely, great amounts of nitrogen are introduced in the hexagonal lattice as impurities. This nitrogen has flat (shallow) donor levels which very greatly increase the conductivity of the material because of electron emissions into the conduction band. Since vanadium in SiC also has a donor level, it cannot be used for compensation of the flat shallow trap. For this reason it is suggested here to nevertheless utilize the deep traps of the vanadium since they are located almost in the center of the energy gap of hexagonal SiC. Therefore, first the donor levels of nitrogen are slightly overcompensated by an aluminum doping. The concentration of the trivalent doping materials is selected to be 2 to 30% greater than the concentration of pentavalent impurities. The flat (shallow) acceptor levels of the aluminum which are then electrically active can finally be completely compensated by the low donor levels of the vanadium. In this case the concentration of the transition element is preferably selected to be greater by at least a factor of 2 than the difference between the concentrations of the tri- and pentavalent foreign atoms. An overcompensation of vanadium, in turn, is not important for conductivity because the levels are so deep that they cannot be thermally activated.

In a preferred exemplary embodiment of the invention a disk of monocrystalline 6H-SiC with a remaining background doping with nitrogen of $5 \cdot 10^{16}$/ccm is used. p-doping is performed with aluminum at a concentration of $1 \cdot 10^{17}$/ccm. The vanadium doping is $2 \cdot 10^{17}$/ccm. Regardless of the type of introduction of the doping, the specific resistance is at least $10^8$ Ohm·cm at 300° K.

In accordance with the invention an arrangement will of course be made for only a small proportion of electrically active impurities to be present, in which impurities with donor properties are preponderant. In the course of introducing transition elements, an amount of doping material is employed which exceeds the total amount of all electrically active impurities.

In a further exemplary embodiment of the invention, doping is performed prior to the production of a monocrystal. To accomplish this, the monocrystalline SiC is produced in accordance with the sublimation process of Lely. The poly-crystalline starting crystal used preferably contains metallic vanadium and aluminum. The trivalent doping materials and transition elements are therefore introduced together at the start of the production process. In a variant of the process, the metallic vanadium and aluminum are separately vaporized. This suggests the sequential introduction of the doping materials, wherein it is practical to perform a determination of the charge carrier concentration prior to the introduction of the last doping material. Here, too, the production of the monocrystal is performed by sublimation of a less perfect crystal, wherein simultaneously the doting materials are created in the vapor phase and deposited on the substrate of the SiC crystal, and these electrically active doping materials have a greater concentration than the impurities introduced by the sublimation process.

In a further process of importance for the invention a further monocrystalline SiC layer is deposited on an SiC substrate by means of epitaxy. Vanadium is applied with the aid of vanadium chloride or an organometallic compound by means of a CVD process. Doping with vanadium is $2 \cdot 10^{17}$/ccm as in the first example.

A thin high-resistance layer of SiC is created by this. In a further preferred process, thin layers are also made high-resistant by ion implantation of vanadium and aluminum.

The high-resistance material is also suitable as an encapsulation of SiC structural elements. The substrate plate is readily suitable as base plate for the so-called packaging of structural elements. The same applies for contacting, wherein the substrate disk represents a mechanically stable contact carrier.

The process can also be transferred to cubic 3C-SiC. This structure is preferred with epitaxic growth. Here, too, nitrogen as an impurity during the growth of the layer leads to p-conductivity, which is effectively suppressed with this method. If the donor level of vanadium of 6H-SiC is made the basis and the relationships of the energy gaps are taken into consideration, it is possible to estimate that the donor level of the vanadium atom in 3C-SiC lies at Ev=1.7 eV. This value exceeds the ideal energy gap center by only 0.5 eV. For this reason doping with vanadium also leads to epitaxic 3C-SiC layers having a high specific resistance.

We claim:

1. A process for producing high-resistance silicon carbide from a low-resistance silicon-carbide starting material, wherein shallow donor levels of prevailing nitrogen impurities are overcompensated by the addition of a trivalent element with shallow acceptor levels introduced by doping in the SiC in a concentration which changes the conductivity type from n- to p- conductivity, and furthermore a transition element which, in SiC, has donor levels in the center of its energy gap is added, by doping to in turn compensate for excess acceptor levels, so that a high specific resistance is achieved.

2. A process in accordance with claim 1, wherein the trivalent element used as doping material with a shallow acceptor level is from the third main group of elements.

3. A process in accordance with claim 1, wherein the trivalent element aluminum (Al) is used as doping material with a shallow acceptor level.

4. A process in accordance with claim 1, wherein vanadium (V) is used as the transition element.

5. A process in accordance with claim 1, wherein the trivalent element used as doping material has a concentration selected to be 2 to 30% greater than the concentration of pentavalent impurities.

6. A process in accordance with claim 1, wherein the transition element has a concentration selected to be greater by at least a factor of 2 than the difference between the concentrations of the trivalent and pentavalent element atoms.

7. A process in accordance with claim 1, wherein the trivalent and transition elements are introduced together at the start of the production process.

8. A process in accordance with claim 1, wherein the trivalent element and transition element are introduced sequentially, wherein a determination of charge carrier concentration is performed prior to the addition of the last doping element.

9. A process in accordance with claim 1, wherein a small proportion of electrically active impurities is present, in which impurities with donor properties dominate, and the step of introducing transition elements in an amount which exceeds the total amount of all electrically active impurities is performed prior to the production of a monocrystal as a starting material.

10. A process in accordance with claim 1, wherein the production of a monocrystal starting material is performed by the sublimation of a less perfect crystal, wherein the doping of the element is simultaneously created in the vapor phase and precipitated on the substrate of the SiC crystal, and these electrically active doping elements have a greater concentration than the impurities introduced by the sublimation process.

11. A process of producing an SiC crystal in accordance with claim 1 wherein the starting material has electrically active impurities preponderantly in the form of nitrogen, whose concentration is approximately $5 \cdot 10^{16}$/ccm, and wherein the high resistance silicon carbide has a specific resistance of at least $10^8$ Ohm·cm at 300° K.

12. An Sic crystal formed by a process in accordance with claim 11, wherein the SiC crystal has a hexagonal crystalline structure.

13. An SiC crystal formed by a process in accordance with one of claim 1, wherein the SiC crystal has a cubic crystalline structure.

14. A process in accordance with claim 5, wherein the transition element has a concentration selected to be greater by at least a factor of 2 than the difference between the concentrations of the trivalent and pentavalent element atoms.

15. A process in accordance with claim 9, wherein the production of the monocrystal starting material is performed by the sublimation of a less perfect crystal, wherein the doping elements are simultaneously created in the vapor phase and precipitated on the substrate of the SiC crystal, and these electrically active doping elements have a greater concentration than the impurities introduced by the sublimation process.

* * * * *